United States Patent
Chen et al.

(10) Patent No.: US 7,208,398 B2
(45) Date of Patent: Apr. 24, 2007

(54) METAL-HALOGEN PHYSICAL VAPOR DEPOSITION FOR SEMICONDUCTOR DEVICE DEFECT REDUCTION

(75) Inventors: Peijun J. Chen, Dallas, TX (US); Duofeng Yue, Plano, TX (US); Douglas E. Mercer, Richardson, TX (US); Noel Russell, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 354 days.

(21) Appl. No.: 10/903,805

(22) Filed: Jul. 30, 2004

(65) Prior Publication Data

US 2005/0208762 A1    Sep. 22, 2005

(51) Int. Cl.
  *H01L 21/28*    (2006.01)
(52) U.S. Cl. ............... 438/581; 438/583; 257/E21.199
(58) Field of Classification Search ............... 438/142, 438/197, 570–583
  See application file for complete search history.

(56) References Cited

U.S. PATENT DOCUMENTS

| | | | |
|---|---|---|---|
| 4,619,038 A * | 10/1986 | Pintchovski ............... | 438/586 |
| 5,831,335 A * | 11/1998 | Miyamoto ............... | 257/757 |
| 5,880,500 A * | 3/1999 | Iwata et al. ............... | 257/336 |
| 5,963,497 A | 10/1999 | Holland | |
| 6,222,786 B1 | 4/2001 | Holland et al. | |
| 6,288,959 B1 | 9/2001 | OuYang et al. | |
| 6,510,091 B1 | 1/2003 | Braceras et al. | |
| 2004/0101999 A1* | 5/2004 | Oda et al. ............... | 438/197 |

FOREIGN PATENT DOCUMENTS

KR    2002002739 A *    1/2002

* cited by examiner

*Primary Examiner*—Brook Kebede
(74) *Attorney, Agent, or Firm*—Peter K. McLarty; W. James Brady, III; Frederick J. Telecky, Jr.

(57) ABSTRACT

The present invention provides a method of manufacturing a metal silicide electrode (100) for a semiconductor device (110). The method comprises depositing by physical vapor deposition, halogen atoms (120) and transition metal atoms (130) to form a halogen-containing metal layer (140) on a semiconductor substrate (150). The halogen-containing metal layer and the semiconductor substrate are reacted to form a metal silicide electrode. Other aspects of the present invention include a method of manufacturing an integrated circuit (400) comprising the metal silicide electrode.

20 Claims, 5 Drawing Sheets

METAL-HALOGEN PHYSICAL VAPOR DEPOSITION FOR SEMICONDUCTOR DEVICE DEFECT REDUCTION

TECHNICAL FIELD OF THE INVENTION

The present invention is directed, in general, to a method for manufacturing a semiconductor device, and more specifically, to a method for manufacturing devices having metal silicide electrodes thereon.

BACKGROUND OF THE INVENTION

The continuing push to produce faster semiconductor devices with lower power consumption has resulted in transistor miniaturization and higher integrated circuit packing densities with each new technology node. For instance, transistors with smaller components allow a higher packing density, which is conducive to faster device operating speeds. Along with shrinking transistor geometries, however, also come a number of challenges to optimize both transistor and integrated circuit (IC) layout design.

One consequence of transistor miniaturization is the construction of smaller gates and source/drain regions in transistors. This, in turn, has caused changes in the composition and construction of the source/drain electrodes used to facilitate device interconnection. To produce a transistor with a sufficiently low series resistance, each transition to a new technology node, has seen the source/drain electrode's composition change from titanium silicide, to cobalt silicide, and now nickel silicide.

Unfortunately a number of problems have been encountered when manufacturing transistors with nickel silicide source/drain electrodes. In some cases, unacceptable numbers of nonfunctional transistors are constructed. In other instances, the source and drain regions punch through the source/drain junction into the semiconductor substrate, resulting in a large leakage current. In still other cases, there is an unacceptably large diode leakage between the source and drain regions and the semiconductor substrate. These problems contribute to the production of unacceptably low yields of transistors that operate within performance specifications.

Accordingly, what is needed in the art is method of manufacturing a semiconductor device with metal silicide source/drain electrodes that do not suffer from the disadvantages associated with conventionally manufactured metal silicide source/drain electrodes, as discussed above.

SUMMARY OF THE INVENTION

To address the above-discussed deficiencies of the prior art, the present invention provides in one embodiment, a method of manufacturing a metal silicide electrode for a semiconductor device. The method comprises depositing by physical vapor deposition, halogen atoms and transition metal atoms to form a halogen-containing metal layer on a semiconductor substrate. The method further comprises reacting the halogen-containing metal layer and the semiconductor substrate to form a metal silicide electrode.

Another aspect of the present invention is a method of manufacturing an integrated circuit. This embodiment includes forming metal silicide electrodes on a semiconductor device as described above. The method also includes forming interconnect metals lines on one of more insulating layers located over the semiconductor device and connecting the interconnects with the metal silicide electrodes to form an operative device.

The foregoing has outlined preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the scope of the invention.

BRIEF DESCRIPTION OF THE DRAWINGS

For a more complete understanding of the present invention, reference is now made to the following detailed description taken in conjunction with the accompanying FIGUREs. It is emphasized that various features may not be drawn to scale. In fact, the dimensions of various features may be arbitrarily increased or reduced for clarity of discussion. In addition, it is emphasized that some circuit components may not be illustrated for clarity of discussion. Reference is now made to the following descriptions taken in conjunction with the accompanying drawings, in which.

DETAILED DESCRIPTION

Figure 1:
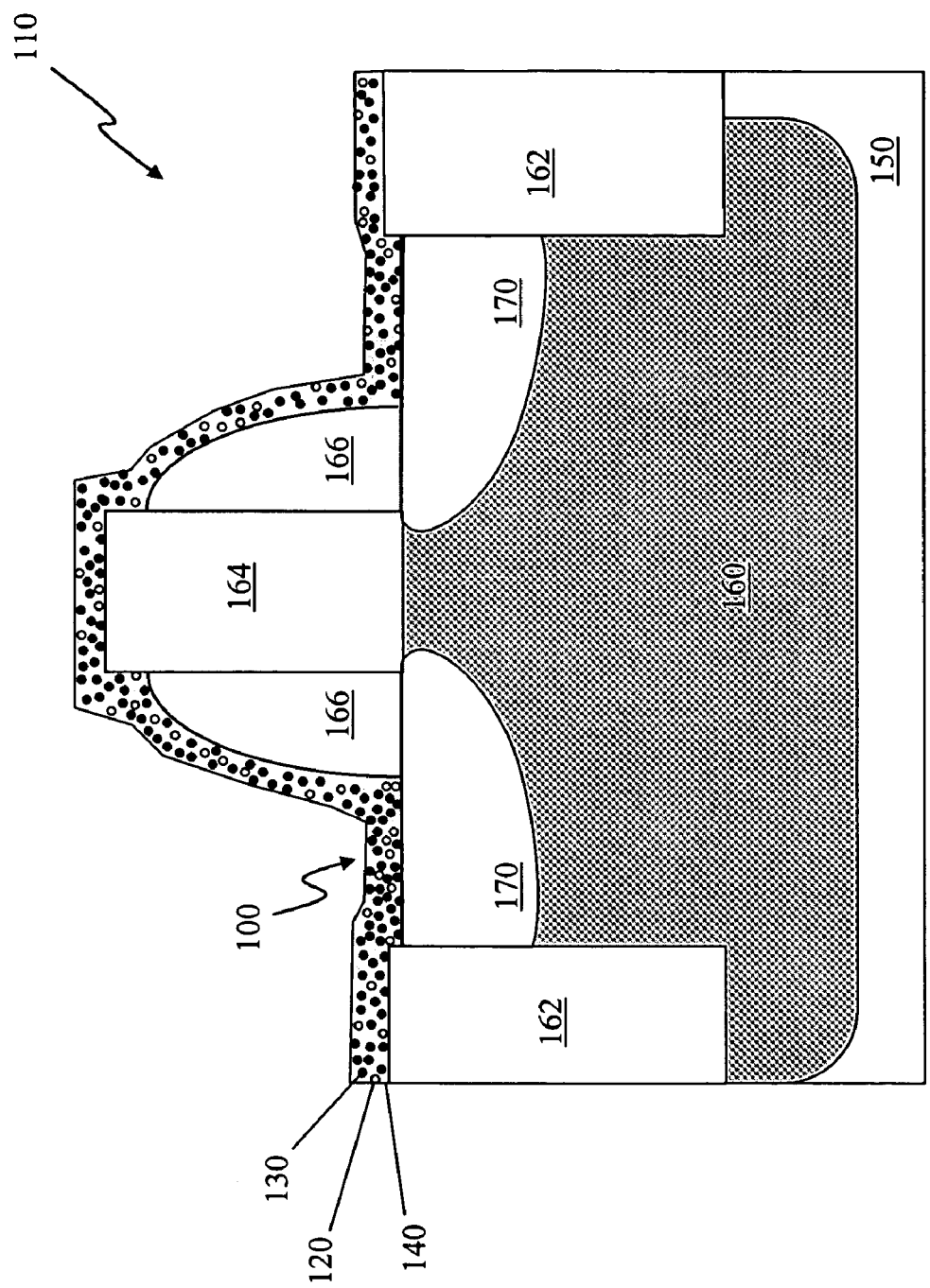
FIGS. 1–3 illustrate cross-sectional views of selected steps in an exemplary method of manufacturing a metal silicide electrode for a semiconductor device according to the principles of the present invention.

During the course of studying transmission electron microscope images (TEM) of MOS transistors having nickel silicide source/drain electrodes, spike-shaped and pipe-shaped defects due to excessive encroachment in both the vertical and lateral directions were detected. The vertical encroachment defects, mostly in the form of spikes, were portions of the source/drain electrodes that protruded into the silicon substrate below the source/drain region. The lateral encroachment defects, mostly in the form of pipes, were portions of the source/drain electrodes that protruded into the source/drain extension region of the transistor underneath the side wall spacer, and in some cases, beyond the source/drain into the channel region of the transistor. It is thought that the formation of these encroachment-related pipe and spike defects is due to the presence of favorable paths or channels in the source/drain regions and the silicon substrate that (locally) enhances the diffusion of nickel. The pipe or spike defects are formed when a nickel layer over the source/drain region is reacted with the underlying silicon substrate to form nickel silicide source/drain electrodes. Nickel atoms that rapidly diffuse through the channels upon silicidation, becomes nickel silicide pipes and spikes. Moreover, it is also known from structural and compositional analyses that the spike-shaped defects are mainly consisted of nickel disilicide crystal grains.

It is further thought that the encroachment-related pipe and spike defects cause poor transistor performance characteristics or reduce the yield of functional transistors. For instance, spikes can cause shorts and increased leakage currents and diode leakage in semiconductor devices have nickel silicide electrodes. Pipes can similarly protrude beyond the source/drain region, creating shorts to the channel and/or gate electrode of a transistor device. In other cases, the spikes make an interface between a source/drain electrode and a source/drain region irregular. Spikes are thought to increase the series resistance of the transistor because the interface between the source/drain electrode and the source/drain junction is rendered irregular from the presence of spikes. A large surface area associated with an irregular surface causes increased resistance. A higher series resistance, in turn, can reduce the speed at which the transistor can operate and reduce the current output of the transistor.

In addition, the high nickel disilicide content of the pipes and spikes is thought to increase series and contact resistance, because the electrical resistance of nickel disilicide is about 3 to 5 times higher than nickel monosilicide. This is surprising in light of conventional silicide electrode technology, where a titaniium or cobalt disilicide electrode is preferred, and despite the fact that nickel disilicide is the thermodyamically most stable silicide phase and forms a stable interface with silicon with little to no strain at the interface.

While not limiting the scope of the present invention by theory, it is believed that poor lattice matching between the nickel silicide electrode, particularly a nickel monosilicide electrode, and the crystalline silicon substrate is an important factor causing the above-described defects. Because the interface between nickel monosilicide and crystalline silicon does not achieve good lattice matching, the interface is more strained (e.g., possesses high interface free-energy and is therefore thermodynamically unstable) than, for example, an interface between nickel disilicide and crystalline silicon. Strain, in turn, can cause point and extended defects in the interface and the crystalline silicon structure, that can manifest as the above-described channels, which in turn facilitate enhanced nickel diffusion. Moreover, source/drain dopant implantation is thought to enhance the population of these channels.

The present invention addresses these problems by introducing, via physical vapor deposition (PVD), halogen atoms to the silicon substrate that is reacted with the nickel layer to form a nickel silicide electrode. Halogen atoms are thought to passivate broken Si—Si bonds in regions of the interface having point and extended defects. Moreover, by stabilizing the interface through lowering free-energy, halogen passivation is thought to stabilize the nickel monosilicide phase and deter the formation of nickel disilicide. The halogen atom diffusion and interface passivation process is also thought to deter the formation of channels through which the nickel atoms can diffuse.

Various methods have been contemplated for introducing the halogen atoms (see e.g., U.S. Provisional Application No. 60/554,332). Surface treatment with halogen can comprise exposing the semiconductor substrate to halogen-containing chemicals, such as nitrogen trifluoride and ammonia plasma used in the gas-phase dry clean of substrate surfaces. The halogen-containing chemicals, however, can undesirably etch away portions of the semiconductor substrate, by forming volatile silicon-halogen species. There is also an increased risk that oxides will be formed on the surface of the substrate due to exposure of the substrate to the atmosphere during the surface treatment.

Alternatively, halogen atoms can be implanted into the source/drain region before depositing a nickel layer and reacting the nickel with the silicon substrate to form nickel silicide source/drain electrodes. Halogen implantation, similar to source/drain dopant implantation, may also damage regions deep within the substrate, thereby contributing to the formation of the channels and leading to severe diode leakage problem, as disclosed in U.S. Provisional Application No. 60/554,332 entitled, "INTEGRATED CIRCUIT METAL SILICIDE METHOD," filed on Mar. 17, 2004 and which is incorporated herein by reference.

The present invention removes these concerns by introducing halogen atoms to the semiconductor substrate by PVD. The use of PVD to introduce halogen to the source/drain region avoids any potential for substrate damage associated with halogen-implantation. Moreover, the use of PVD to deposit the halogen atoms and the transition metals eliminates the need for separate process steps for introducing halogens. A halogen-containing metal layer deposited by PVD is also desirable because it results in higher concentrations of halogen atoms at the interface than obtained by surface treatment and implantation methods. A higher halogen concentration is obtained at the interface because the halogen atoms are more uniformly introduced into the semiconductor substrate, than halogen atoms introduced via surface treatment or implantation methods.

The above discussion presents aspects of the present invention in the context of nickel silicide electrode-induced defects in dopant-implanted source/drain regions of an MOS transistor. It is emphasized, however, that the scope of the present invention includes reducing such defects in any semiconductor substrate caused by the formation of any electrode comprising a transition metal silicide.

For the purposes of the present invention, a transition metal is defined as any element in Periods 4–6 and Groups 3–12 of the Periodic Table of Elements (International Union of Pure and Applied Chemist Convention for designating Groups and Periods). A halogen is defined as any element in Group 17 of the Periodic Table of Elements.

Figure 2:
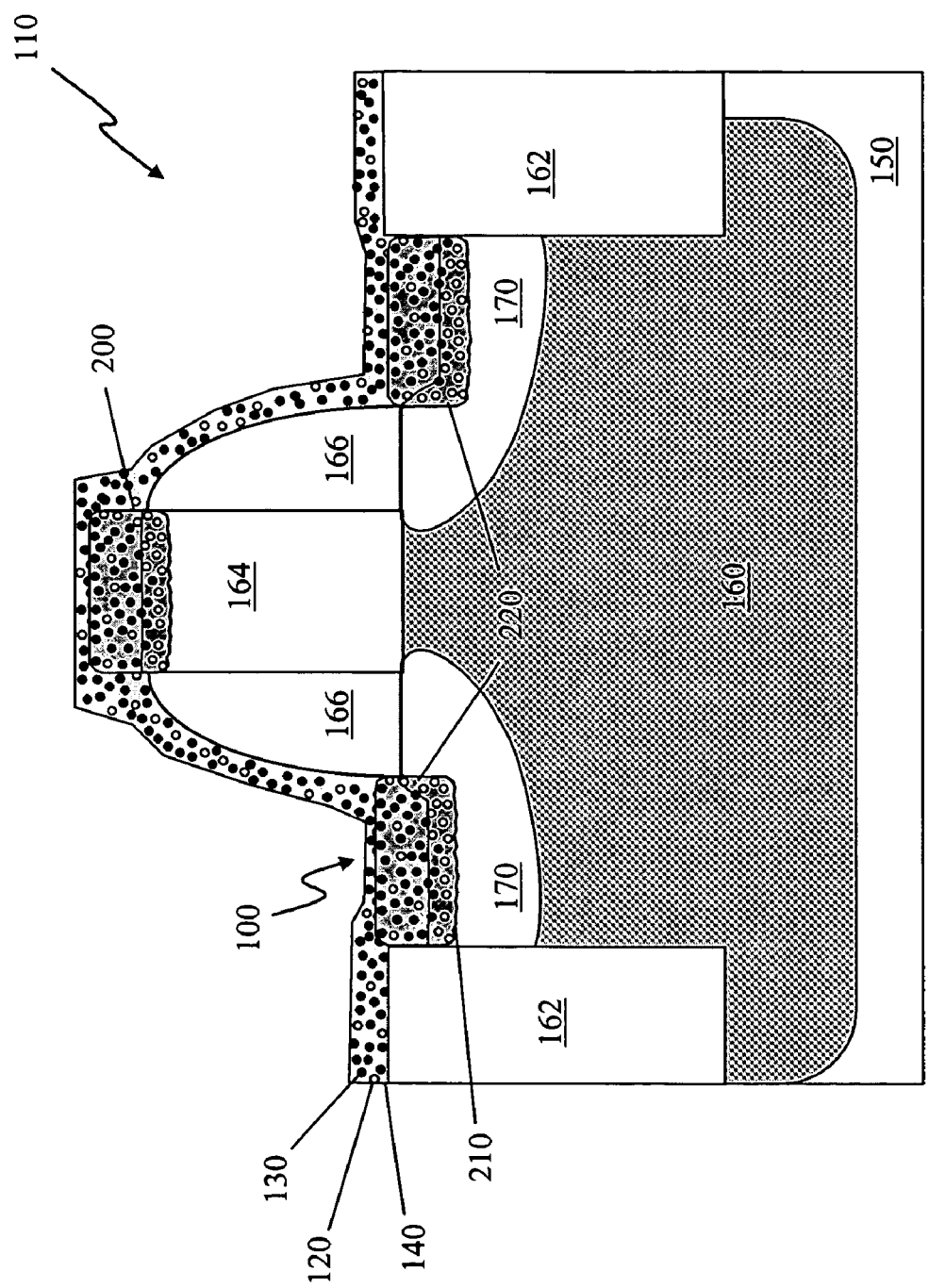
Figure 3:
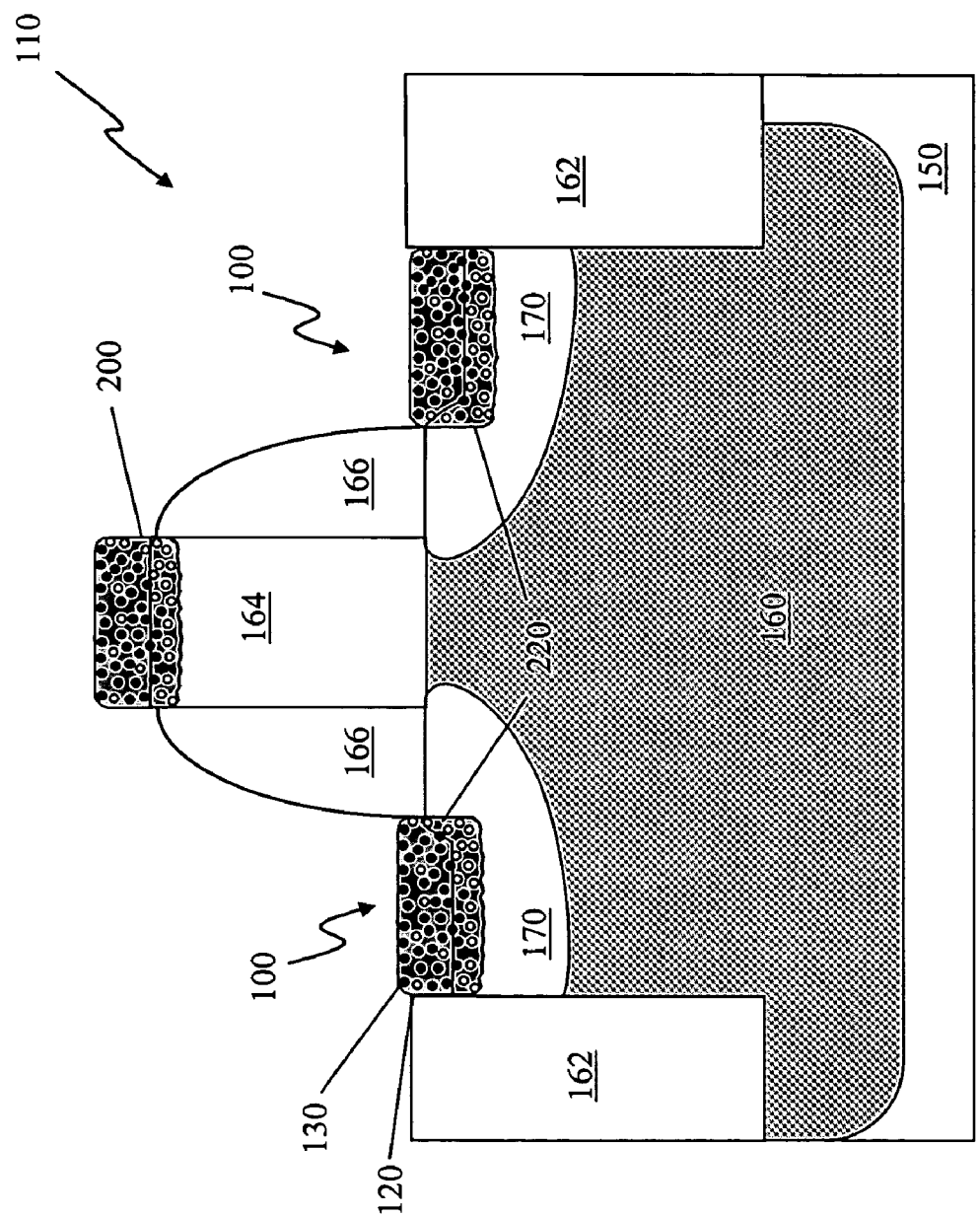

One embodiment of the present invention is a method of manufacturing a metal silicide electrode. FIGS. 1 to 3 illustrate cross-sectional views of selected steps in exemplary methods of manufacturing a metal silicide electrode 100 for a semiconductor device 110 according to the principles of the present invention.

Turning first to FIG. 1, illustrated is the partially constructed metal silicide electrode 100 after depositing, by physical vapor deposition, halogen atoms 120 and transition metal atoms 130 to form a halogen-containing metal layer 140 on a semiconductor substrate 150.

In some advantageous embodiments of the method, the MOS semiconductor substrate 150 comprises silicon, although other conventional substrate materials, such as silicon-on-insulator (SOI) and silicon-germanium substrates, are also within the scope of the invention. For example, the semiconductor substrate 150 can comprise a layer located below the partially completed semiconductor device 150, and include a silicon wafer itself or a layer located above the wafer as an epitaxial layer, such as a silicon layer of SOI substrate, or other substrate. Some preferred embodiments of the MOS semiconductor substrate 150 include <100> silicon wafers having a 0 degree or a 45 degree cut. Other types of silicon wafers, such as <111> or <011> wafers, and silicon wafers having different cut angles, can also be used, however.

The semiconductor substrate 150 preferably includes a well 160 that is doped with a p-type dopant, such as boron, or an n-type dopant, such as arsenic, when the semiconductor device 110 comprises an nMOS or a pMOS transistor, respectively. Other components of the semiconductor device 110, such as isolation 162, a gate 164, and gate sidewall 166 structures can be formed on or in the semiconductor substrate 150 using conventional techniques.

As further illustrated in FIG. 1, in some preferred embodiments of the method, the halogen atoms 120 and transition metal atoms 130 are blanket deposited as the halogen-containing metal layer 140 over the entire surface of the semiconductor substrate 150, and preferably on conventionally formed source/drain regions 170 that are located in the substrate 150. As depicted in FIG. 1, in some cases, it is preferable to co-deposit the halogen atoms 120 and transition metal atoms 130 because only a single PVD step is then required. Moreover, co-deposition facilitates a homogenous mixture of halogen atoms 120 and transition metal atoms 130 in the halogen-containing metal layer 140. In some instances, the halogen-containing metal layer 140 has a thickness of between about 5 nanometers and about 30 nanometers.

In some embodiments of the method, the transition metal atoms 130 comprise nickel. The transition metal atoms 130, however, can also comprise titanium, cobalt, platinum, and palladium and combinations of transition metals. Alloys of nickel and platinum or nickel and palladium are preferred because diffusivity of nickel is decreased in these alloys. Nickel is preferred for a number of reasons. Nickel silicide formation can be performed using relatively low temperatures as compared to other metals. This, in turn, reduces the thermal budget that the device 110 is exposed to during its fabrication, thereby reducing manufacturing costs. Nickel silicide has a low resistivity as compared to a number of other transition metal silicides. This is important for maintaining the series resistance of the semiconductor device 110 within acceptable limits when constructing smaller, faster devices. Moreover, nickel silicide is not prone to resistivity degradation due to the necking phenomenon observed when using other metal suicides, such as cobalt silicide, at device feature sizes of less than about 90 nanometers.

In some preferred embodiments, the halogen atoms 120 comprise fluorine atoms. Fluorine is preferred because its small atomic mass enables it to more rapidly diffuse through the semiconductor substrate 150, as compared to other halogens like chlorine or bromine. Other advantageous embodiments of the halogen atoms, however, can comprise chlorine or bromine or mixtures of fluorine, chlorine and bromine.

A preferred PVD method is sputtering. In some preferred embodiments, sputtering is from a metal halogen target. A sputtering target with a low halogen content is desirable because this helps ensure that metal halogen target comprises a homogenous mixture of halogen atoms 120 transition metal atoms 130. It is desirable, to include enough halogen in the target to substantially passivate the point and extended defects in semiconductor substrate 150 as discussed above. In some advantageous embodiments, for instance, the metal halogen target comprises between about 0.001 and about 1 atom percent halogen.

Some preferred embodiments of sputtering include a direct current power of about 600 Watts and a sputtering chamber argon gas vapor pressure of about 5 Torr. One of ordinary skill in the art would understand how to adjust and to select the sputtering method and conditions to deposit the halogen atoms 120 and the transition metal atoms 130. Of course, sputtering can be accomplished using other techniques including alternating current, radio frequency, magnetron or other commercially available sputtering systems. Moreover, other conventional PVD techniques, including evaporative deposition, molecular beam epitaxy, ion plating, ion beam assisted deposition using an electron beam evaporator and arc vapor deposition are also within the scope of the present invention.

In certain preferred embodiments of the method, the halogen-containing metal layer 140 has substantially identical transition metal atom and halogen concentrations (e.g., within about 10 percent) as the metal halogen target. In some embodiments the halogen-containing metal layer 140 has a halogen concentration of between about 0.001 atom percent and about 1 atom percent. A halogen concentration of at least about 0.001 percent is desirable to ensure that there are is sufficient numbers of halogen atoms 120 to substantially passivate the semiconductor substrate 150 during the subsequent metal silicidation reaction.

With continuing reference to FIG. 1, FIG. 2 depicts the partially completed metal silicide electrode 100 after reacting the halogen-containing metal layer 140 and the semiconductor substrate 150. The halogen-containing metal layer 140 reacts with a portion of the source/drain region 170, resulting in the metal silicide electrode 100 being formed on the source/drain region 170. As further illustrated in FIG. 2, a metal silicide gate electrode 200 can also be formed by reacting the halogen-containing metal layer 140 with a portion of the gate structure 164, when the gate structure comprises silicon.

In certain advantageous embodiments of the method, the metal silicide electrode 100 comprises nickel silicide, and more preferably, metal monosilicide such as nickel monosilicide. In some advantageous embodiments, metal silicide electrode 100 has a thickness that is between about 1 and about 2 times the thickness of the halogen-containing metal layer 140 shown in FIG. 1. In other preferred embodiments, the metal silicide electrode 100 has a thickness of between about 10 nanometers and about 60 nanometers, and more preferably between about 10 and about 30 nanometers.

In some preferred embodiments of the method, an interface 210 between the metal silicide electrode 100 and the semiconductor substrate 150 has an average root-mean-square (RMS) roughness of less than about 40 percent. The term average RMS roughness as used herein refers to the average percent deviation in the thickness of the metal silicide electrode 100 at the interface 210 between silicide electrode 100 and the semiconductor substrate 100. As illustrated in FIG. 2, the interface 210 is between the metal silicide electrode 100 and the source/drain region 170 of the substrate 150. One of ordinary skill in the art would understand how to measure the roughness of the interface 210. As an example, the average and standard deviation (RMS) of the thickness of the metal silicide electrode 100 can be measured at a plurality of locations (e.g., at least about 20 locations) in a TEM image cross-section of the semiconductor substrate 150, and then the percent standard deviation in the thickness calculated.

The diffusion of halogen atoms 120 follows the growth front of the metal silicide electrode 100 during the reaction between the halogen-containing metal layer 140 and the semiconductor substrate 150. This phenomenon, commonly referred to as snowplowing, advantageously results in the accumulation of halogen atoms 120 in a zone 220 of the metal silicide electrode 100 located at the interface 210. In some embodiments, the zone 220 occupies about one-third, and more preferably less than one-third, of the thickness of the metal silicide electrode 100. In some preferred embodiments, the zone 220 has at least about 5E10 halogen atom/cm$^2$. In other preferred embodiments the zone 220 has between about 5E10 and about 1E13 halogen atoms/cm$^2$.

In some advantageous embodiments of the method, the reaction to form the metal silicide electrode 100 comprises heating the halogen-containing metal layer 140 and the semiconductor substrate 150 to between about 250° C. and about 550° C. for at least about 0.1 second. In other advantageous embodiments, heating comprises a first heating step to a temperature between about 250 and about 350 for at least about 0.1 second to form the metal silicide 100, and a second heating step to a temperature of between 350° C. and 550° C. for at least about 0.1 second to anneal the metal silicide 100. In some cases, it is desirable to heat to a temperature below about 400° C. to deter the formation of nickel disilicide. One of ordinary skill in the art would understand how to adjust the temperature and duration of heating to achieve silicidation of different transition metals.

Turning now to FIG. 3, with continuing reference to FIGS. 1–2, illustrated is the metal silicide electrode 100 after removing unreacted portions of the halogen-containing metal layer 140 shown in FIG. 2. Suitable methods to remove the unreacted portions of the halogen-containing metal layer 140 include dry and wet etch procedures. One of ordinary skill in the art would understand how to tailor these procedures to selectively remove the unreacted portions of the halogen-containing metal layer 140 while leaving the metal silicide electrode 100 substantially intact.

Also included in the scope of the present invention is a metal silicide electrode 100, or the semiconductor device 110 comprising one or more metal silicide electrodes 100, manufactured as described above. In some preferred embodiments, the semiconductor device 110 is a MOS transistor such as an nMOS or a pMOS transistor. Of course, additional conventional steps in semiconductor device 110 fabrication can be included with the above-described method of manufacturing metal silicide electrodes to make an operative device.

Figure 4:
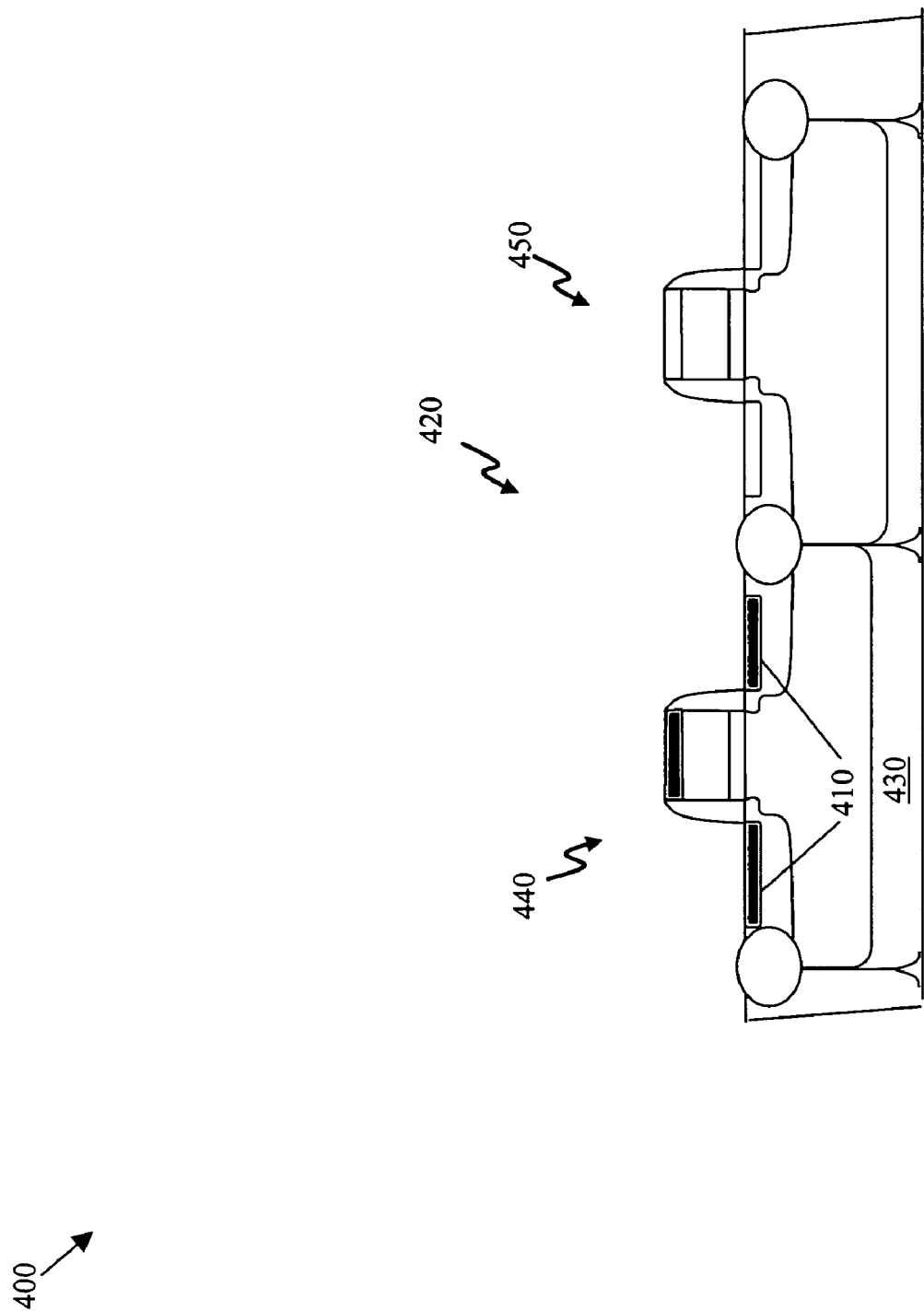
FIGS. 4–5 illustrate cross-sectional views of selected steps in an exemplary method of manufacturing an integrated circuit following the principles of the present invention.
Figure 5:
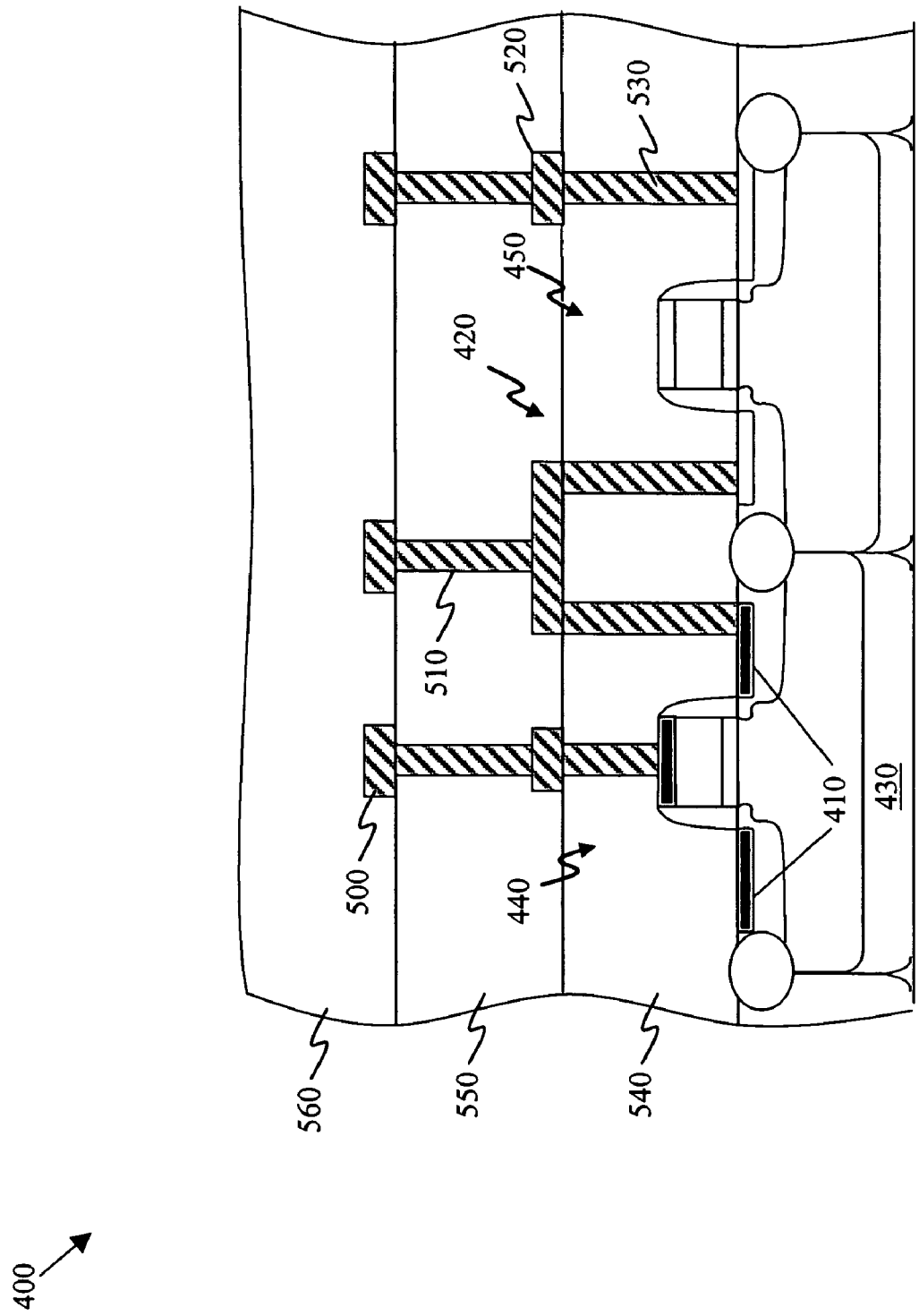

Another aspect of the present invention is a method of manufacturing an integrated circuit. FIGS. 4–5 illustrate cross-sectional views of selected steps in an exemplary method of manufacturing an integrated circuit 400 according to the principles of the present invention. Turning first to FIG. 4, illustrated is the partially completed integrated circuit 400 after forming metal silicide electrodes 410 for a semiconductor device 420. Any of the methods and materials discussed above and illustrated in FIGS. 1–3 can be used to fabricate metal silicide electrodes 410 on a semiconductor substrate 430.

Preferred embodiments of the semiconductor device 420 comprise an MOS transistor 440, and more preferably, an nMOS or a pMOS transistor. The semiconductor device 420 can further include other conventionally formed transistors 450 such as nMOS or pMOS transistors. In some cases, the semiconductor device 420 comprises a CMOS device. However the semiconductor device 420 can also comprise Junction Field Effect transistors, bipolar transistors, biCMOS transistors, or other conventional device components, and combinations thereof.

With continuing reference to FIG. 4, FIG. 5, illustrates the integrated circuit 400 after forming interconnections 500, 510, 520, 530 on one or more insulating layers 540, 550, 560 located over the semiconductor device 420. One or more of the interconnections 500, 510, 520, 530 are connected to the metal silicide electrodes 410 and thereby interconnect the semiconductor device 420 to form an operative device.

Although the present invention has been described in detail, those skilled in the art should understand that they can make various changes, substitutions and alterations herein without departing from the scope of the invention in its broadest form.

What is claimed is:

1. A method of manufacturing a metal silicide electrode for a semiconductor device, comprising:
   depositing by physical vapor deposition, halogen atoms and transition metal atoms to form a halogen-containing metal layer on a semiconductor substrate; and
   reacting said halogen-containing metal layer and said semiconductor substrate to form a metal silicide electrode.

2. The method as recited in claim 1, wherein physical vapor deposition comprises sputtering from a metal halogen target.

3. The method as recited in claim 2, wherein said metal halogen target comprises nickel.

4. The method as recited in claim 3, wherein said metal halogen target is consisting of palladium, platinum or a mixture thereof.

5. The method as recited in claim 2, wherein said metal halogen target comprises fluorine.

6. The method as recited in claim 2, wherein said metal halogen target is consisting of fluorine, chlorine, bromine or a mixture thereof.

7. The method as recited in claim 1, wherein said metal halogen target comprises a halogen at a concentration of between about 0.001 and about 1 atom percent.

8. The method as recited in claim 2, wherein said halogen-containing metal layer has substantially identical transition metal and halogen concentrations as said metal halogen target.

9. The method as recited in claim 1, wherein reacting comprises heating said transition metal layer and said semiconductor substrate to between about 250° C. and about 550° C. for at least about 0.1 second.

10. The method as recited in claim 1, wherein reacting comprises heating said transition metal layer and said semiconductor substrate to between about 250° C. and about 350° C. for at least about 0.1 second.

11. The method as recited in claim 1, wherein a zone of said metal silicide electrode has at least about 5E10 halogen atom/cm$^2$.

12. The method as recited in claim 11, wherein a zone of said metal silicide electrode has between about 5E10 and about 1E13 halogen atoms/cm$^2$.

13. The method as recited in claim 11, wherein a thickness of said zone is less than about one-third a thickness of said metal silicide electrode.

14. The method as recited in claim 1, wherein said metal silicide electrode has a thickness of between about 10 and about 60 nanometers.

15. The method as recited in claim 1, wherein an interface between said metal silicide electrode and said semiconductor substrate has an average root-mean-square roughness of less than about 40 percent.

16. The method as recited in claim 1, wherein said metal silicide electrode comprises nickel monosilicide source/drain or gate electrodes for a MOS transistor.

17. A method of manufacturing an integrated circuit comprising:
   forming metal silicide electrodes for a semiconductor device, comprising:
      depositing by physical vapor deposition, halogen atoms and transition metal atoms to form a halogen-containing metal layer on a semiconductor substrate; and reacting said halogen-containing metal layer and said semiconductor substrate to form a metal silicide electrode; and forming interconnect metals lines on one of more insulating layers located over said semiconductor device and connecting said interconnects with said metal silicide electrodes to form an operative device.

18. The method as recited in claim 17, wherein said metal silicide electrode comprises nickel silicide.

19. The method as recited in claim 17, wherein a zone of said metal silicide electrode has at least about 5E10 halogen atoms/cm$^2$.

20. The method as recited in claim 17, wherein said semiconductor device is selected from the group consisting of:
nMOS transistors;
pMOS transistors;
CMOS devices;
Junction Field Effect transistors;
bipolar transistors;
biCMOS transistors; and
combinations thereof.

* * * * *